US012652059B2

(12) United States Patent
Nandi et al.

(10) Patent No.: US 12,652,059 B2
(45) Date of Patent: Jun. 9, 2026

(54) CAPACITIVE DIGITAL-TO-ANALOG CONVERTERS WITH SHAPED OUTPUT CURRENT

(71) Applicant: Skyworks Solutions, Inc., Irvine, CA (US)

(72) Inventors: Timir Nandi, Santa Clara, CA (US); Praveen Kumar Venkatachala, Portland, OR (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 113 days.

(21) Appl. No.: 18/618,630

(22) Filed: Mar. 27, 2024

(65) Prior Publication Data
US 2024/0348260 A1 Oct. 17, 2024

Related U.S. Application Data

(60) Provisional application No. 63/496,196, filed on Apr. 14, 2023.

(51) Int. Cl.
H03M 1/66 (2006.01)

(52) U.S. Cl.
CPC ..................................... H03M 1/66 (2013.01)

(58) Field of Classification Search
CPC ....................................................... H03M 1/66
USPC ....................................................... 341/144
See application file for complete search history.

(56) References Cited

U.S. PATENT DOCUMENTS

| | | | |
|---|---|---|---|
| 4,384,276 A | 5/1983 | Kelley et al. | |
| 8,970,415 B2 | 3/2015 | Quiquempoix | |

| | | | |
|---|---|---|---|
| 8,970,416 B2 | 3/2015 | Quiquempoix | |
| 9,418,788 B2 | 8/2016 | Srinivas et al. | |
| 9,444,481 B1 * | 9/2016 | Jain ...................... | H03M 1/1245 |
| 9,654,135 B2 | 5/2017 | Miki et al. | |
| 9,966,969 B1 * | 5/2018 | Engel .................... | H03M 1/662 |
| 10,396,815 B1 * | 8/2019 | Kuttner ................... | H03M 1/70 |
| 10,523,228 B1 | 12/2019 | Chao | |
| 10,601,437 B1 | 3/2020 | Kuttner | |
| 10,715,163 B2 | 7/2020 | Chao | |
| 11,018,688 B1 | 5/2021 | Guo et al. | |

(Continued)

FOREIGN PATENT DOCUMENTS

| | | | | |
|---|---|---|---|---|
| WO | 2015200267 | * | 12/2015 | .............. H03M 3/00 |

OTHER PUBLICATIONS

Nandi et al., "Continuous-time ΔΣ modulators with improved linearity and reduced clock jitter sensitivity using the switched-capacitor return-to-zero Dac", IEEE Journal of Solid-State Circuits, vol. 48(8):1795-1805 (2013).

*Primary Examiner* — Jean B Jeanglaude

(74) *Attorney, Agent, or Firm* — Knobbe, Martens, Olson & Bear, LLP

(57) ABSTRACT

Capacitive digital-to-analog converters (DACs) with shaped output current are disclosed. A capacitive DAC converter cell for a capacitive DAC includes a capacitor connected between an output terminal and an internal node, a first current source, a first switch connected in series with the first current source between the internal node and a first voltage, a second current source, a second switch connected in series with the second current source between the internal node and a second voltage, a third switch connected between the internal node and the first voltage, and a fourth switch connected between the internal node and the second voltage.

20 Claims, 5 Drawing Sheets

(56)  References Cited

U.S. PATENT DOCUMENTS

| | | | |
|---|---|---|---|
| 11,043,959 B1* | 6/2021 | Melanson | H03M 3/376 |
| 11,190,198 B1 | 11/2021 | Huang et al. | |
| 11,245,412 B2 | 2/2022 | Chao | |
| 11,990,918 B2 | 5/2024 | Guo et al. | |
| 2002/0113724 A1* | 8/2002 | Yin | H03M 1/0663 |
| | | | 341/150 |
| 2022/0149852 A1* | 5/2022 | Hayashi | H03M 1/0604 |
| 2022/0286098 A1* | 9/2022 | Zhao | H03F 3/45188 |
| 2023/0098492 A1 | 3/2023 | Venkatachala et al. | |
| 2023/0198533 A1* | 6/2023 | Gruber | H03M 1/687 |
| | | | 341/136 |
| 2023/0275596 A1* | 8/2023 | Engel | H03M 1/1004 |
| 2023/0283291 A1 | 9/2023 | Kim et al. | |
| 2024/0186961 A1 | 6/2024 | Leuenberger et al. | |

* cited by examiner

1

CAPACITIVE DIGITAL-TO-ANALOG CONVERTERS WITH SHAPED OUTPUT CURRENT

CROSS-REFERENCE TO RELATED APPLICATIONS

This application claims the benefit of priority under 35 U.S.C. § 119 of U.S. Provisional Patent Application No. 63/496,196, filed Apr. 14, 2023 and titled "CAPACITIVE DIGITAL-TO-ANALOG CONVERTERS WITH SHAPED OUTPUT CURRENT," which is herein incorporated by reference in its entirety.

BACKGROUND

Field

Embodiments of the invention relate to electronic systems, and in particular, to capacitive digital-to-analog converters.

Description of Related Technology

Digital-to-analog converters (DACs) are used in a wide variety of electronic systems to convert digital signals into analog signals. One type of DAC is a capacitive DAC (CDAC), which includes an array of capacitors that are connected to the CDAC's output and controlled based on a value of a digital input signal. CDACs are used in a wide range of signal processing applications and data conversion systems.

SUMMARY

In certain embodiments, the present disclosure relates to a capacitive digital-to-analog converter (DAC). The capacitive DAC includes an output terminal and a plurality of capacitive DAC cells including a first capacitive DAC cell. The first capacitive DAC cell includes a capacitor connected between the output terminal and an internal node, a first current source, a first switch connected in series with the first current source between the internal node and a first voltage, a second current source, a second switch connected in series with the second current source between the internal node and a second voltage, a third switch connected between the internal node and the first voltage, and a fourth switch connected between the internal node and the second voltage.

In some embodiments, the capacitive DAC further includes a control circuit configured to control the first switch with a first phase one clock signal and to control the third switch with a first phase two clock signal, the first phase two clock signal configured to activate after the first phase one clock signal when the first capacitive DAC cell discharges the internal node.

According to various embodiments, the capacitive DAC further includes an input terminal configured to receive a multi-bit digital input signal, the control circuit configured to select a corresponding charge control operation for each of the plurality of capacitive DAC cells based on a value of the multi-bit digital input signal.

In accordance with several embodiments, activation of the first phase two clock signal occurs after a time interval from activation of the first phase one clock signal, the time interval greater than a discharge time of the first current source to discharge the internal node. According to a number of embodiments, the first current source automatically turns off during the time interval.

According to various embodiments, the control circuit is further configured to control the second switch with a second phase one clock signal and to control the fourth switch with a second phase two clock signal, the second phase two clock signal configured to activate after the second phase one clock signal when the first capacitive digital-to-analog converter cell charges the internal node. In accordance with a number of embodiments, the first switch and the third switch are n-type field-effect transistors, and the second switch and the fourth switch are p-type field-effect transistors. According to several embodiments, the first phase one clock signal toggles between the first voltage and a first cascode voltage, the first phase two clock signal toggles between the first voltage and the second voltage, the second phase one clock signal toggles between a second cascode voltage and the second voltage, and the second phase two clock signal toggles between the first voltage and the second voltage.

In some embodiments, the first voltage is ground and the second voltage is a power supply voltage.

In certain embodiments, the present disclosure relates to a mobile device. The mobile device includes a processor configured to receive digital transducer data and a transducer system configured to provide the digital transducer data to the processor. The transducer system includes a transducer configured to provide an analog input signal to an input node and a capacitive DAC including an output terminal that provides feedback to the input node. The capacitive DAC further includes a plurality of capacitive DAC cells including a first capacitive DAC cell that includes a capacitor connected between the output terminal and an internal node, a first current source, a first switch connected in series with the first current source between the internal node and a first voltage, a second current source, a second switch connected in series with the second current source between the internal node and a second voltage, a third switch connected between the internal node and the first voltage, and a fourth switch connected between the internal node and the second voltage.

In various embodiments, the capacitive DAC further includes a control circuit configured to control the first switch with a first phase one clock signal and to control the third switch with a first phase two clock signal, the first phase two clock signal configured to activate after the first phase one clock signal when the first capacitive DAC cell discharges the internal node.

According to some embodiments, the capacitive DAC further includes an input terminal configured to receive a multi-bit digital input signal, the control circuit configured to select a corresponding charge control operation for each of the plurality of capacitive DAC cells based on a value of the multi-bit digital input signal.

In accordance with several embodiments, activation of the first phase two clock signal occurs after a time interval from activation of the first phase one clock signal, the time interval greater than a discharge time of the first current source to discharge the internal node. According to a number of embodiments, the first current source automatically turns off during the time interval.

According to various embodiments, the control circuit is further configured to control the second switch with a second phase one clock signal and to control the fourth switch with a second phase two clock signal, the second phase two clock signal configured to activate after the second phase one clock signal when the first capacitive DAC cell charges the internal node. In accordance with a number of embodiments, the first switch and the third switch are n-type field-effect transistors, and the second switch and the fourth switch are p-type field-effect transistors.

In accordance with some embodiments, the first phase one clock signal toggles between the first voltage and a first cascode voltage, the first phase two clock signal toggles between the first voltage and the second voltage, the second phase one clock signal toggles between a second cascode voltage and the second voltage, and the second phase two clock signal toggles between the first voltage and the second voltage.

In several embodiments, the first voltage is ground and the second voltage is a power supply voltage.

In various embodiments, the transducer is a microphone.

In certain embodiments, the present disclosure relates to a transducer system. The transducer system includes a transducer configured to generate an analog input signal, an input amplifier configured to receive the analog input signal at an input, and a capacitive DAC including an output terminal connected to the input of the input amplifier. The capacitive DAC further includes a plurality of capacitive DAC cells including a first capacitive DAC cell that includes a capacitor connected between the output terminal and an internal node, a first current source, a first switch connected in series with the first current source between the internal node and a first voltage, a second current source, a second switch connected in series with the second current source between the internal node and a second voltage, a third switch connected between the internal node and the first voltage, and a fourth switch connected between the internal node and the second voltage.

In several embodiments, the capacitive DAC further includes a control circuit configured to control the first switch with a first phase one clock signal and to control the third switch with a first phase two clock signal, the first phase two clock signal configured to activate after the first phase one clock signal when the first capacitive DAC cell discharges the internal node.

According to some embodiments, the capacitive DAC further includes an input terminal configured to receive a multi-bit digital input signal, the control circuit configured to select a corresponding charge control operation for each of the plurality of capacitive DAC cells based on a value of the multi-bit digital input signal.

In accordance with various embodiments, activation of the first phase two clock signal occurs after a time interval from activation of the first phase one clock signal, the time interval greater than a discharge time of the first current source to discharge the internal node. According to a number of embodiments, the first current source automatically turns off during the time interval.

According to some embodiments, the control circuit is further configured to control the second switch with a second phase one clock signal and to control the fourth switch with a second phase two clock signal, the second phase two clock signal configured to activate after the second phase one clock signal when the first capacitive DAC cell charges the internal node. In accordance with a number of embodiments, the first switch and the third switch are n-type field-effect transistors, and the second switch and the fourth switch are p-type field-effect transistors. According to various embodiments, the first phase one clock signal toggles between the first voltage and a first cascode voltage, the first phase two clock signal toggles between the first voltage and the second voltage, the second phase one clock signal toggles between a second cascode voltage and the second voltage, and the second phase two clock signal toggles between the first voltage and the second voltage.

In several embodiments, the first voltage is ground and the second voltage is a power supply voltage.

In some embodiments, the transducer is a microphone.

In various embodiments, the transducer system further includes a loop filter configured to generate a filtered output signal based on filtering an output signal of the input amplifier, a sampling switch configured to generate a plurality of samples based on sampling the filtered output signal, and a quantizer configured to generate the a multi-bit digital signal based on quantizing the plurality of samples. According to several embodiments, the capacitive digital-to-analog converter further includes an input terminal configured to receive the multi-bit digital signal.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
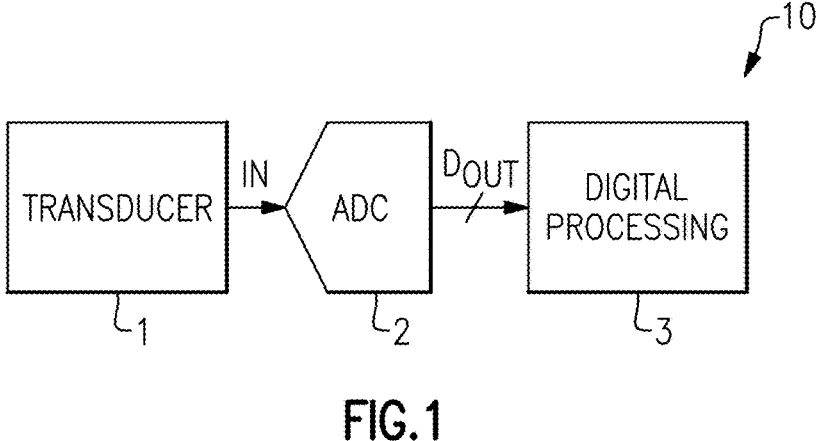
FIG. 1 is a schematic diagram of one embodiment of a transducer system.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one embodiment of a transducer system 10. The transducer system 10 includes a transducer 1, an analog-to-digital converter (ADC) 2, and a digital processing circuit 3.

As shown in FIG. 1, the transducer 1 generates an analog input signal IN, which is provided to the ADC 2 for analog-to-digital data conversion. The ADC 2 processes the analog input signal IN to generate a multi-bit digital output signal $D_{OUT}$, which is provided to the digital processing circuit 3 for further processing.

The transducer system 10 can correspond to a wide variety of systems for digitizing a detected physical quantity from the environment, such as pressure, brightness, temperature, and/or humidity. In one example, the transducer system 10 is an audio processing system in which the transducer 1 corresponds to a microphone, such as a micro-electromechanical systems (MEMS) microphone.

The digital processing circuit 3 can be used to process the multi-bit digital output signal Dour to provide a number of application and/or control functions. The transducer system 10 can be incorporated as a sub-system into a larger electronic system. In one example, the transducer system 10 is incorporated into user equipment (UE) of a cellular network. For example, such UE can correspond to a mobile phone (for instance, a smartphone), a tablet, a smart-vehicle, a computer, and/or an Internet of things (IoT) device.

Figure 2:
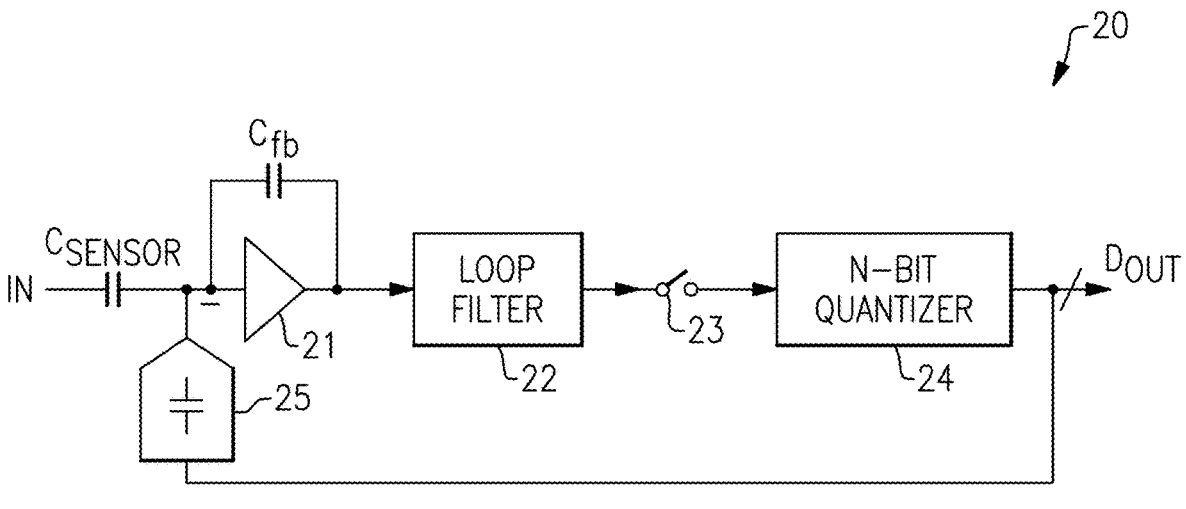
FIG. 2 is a schematic diagram of one embodiment of an analog-to-digital converter (ADC) for a transducer system.

FIG. 2 is a schematic diagram of one embodiment of ADC 20 for a transducer system, such as the transducer system 10 of FIG. 1.

In the illustrated embodiment, the ADC 20 includes a sensor capacitor $C_{SENSOR}$, a feedback capacitor Cho, an input amplifier 21, a loop filter 22, a sampling switch 23, a quantizer 24, and a feedback CDAC 25.

As shown in FIG. 2, the input amplifier 21 includes an input that receives an analog input signal IN through the sensor capacitor $C_{SENSOR}$. The analog input signal IN can be provided by any suitable signal source, including, but not limited to, a transducer such as a microphone.

The input of the input amplifier 21 is also connected to an output of the CDAC 25. Thus, the output of the CDAC 25 provides a first level of feedback at a top level. Additionally, the feedback capacitor Cm is connected from an output of the input amplifier 21 to the input of the input amplifier 21 to provide a second level of feedback at a local level.

The loop filter 22 serves to provide filtering to an output signal provided from the output of the input amplifier 21. The filtered output signal from the loop filter 23 is sampled by the sampling switch 23 and provided to the quantizer 24 for quantizing. The sampling switch 23 can be controlled using any suitable sampling control signal, such as a sampling clock signal generated based on a master clock signal.

The quantizer 24 quantizes the samples of the filtered output signal to generate a multi-bit digital output signal Dour. The quantizer 24 is an n-bit quantizer, in this example. The multi-bit digital output signal Dour can be provided to any suitable digital processing circuit (for example, the digital processing circuit 3 of FIG. 1) for further processing. The multi-bit digital output signal Dour is also provided to the input of the CDAC 25.

In the illustrated embodiment, the CDAC 25 provides negative feedback to the input amplifier 21. In particular, the output of the CDAC 25 is connected to the input of the input amplifier 21, while the input of the CDAC 25 is controlled based on a value of the multi-bit digital output signal $D_{OUT}$.

The CDAC 25 has an output current that is impulsive or includes an impulsive component. Additionally, the impulsive characteristics of the output current can disrupt operation of circuitry connected to the CDAC's output.

For example, in the context of the ADC 20 of FIG. 2, the input amplifier 21 is susceptible to large impulsive fluctuations in the output current of the CDAC 25. Disruption of the input amplifier 21 in turn can lead to non-linearity in the overall operation of the ADC 20.

Although a large series resistor can be included at the input of the input amplifier 21 (or at the output of the CDAC 25) to shape the CDAC's output current to reduce the impact of output current fluctuation, the inclusion of a large series resistor adds noise to the system. Furthermore, in applications in which the input of the system is capacitive (as is the case for the ADC 20 of FIG. 2), the input referred noise becomes a large source of non-ideality.

In another example, the input amplifier 21 can be biased with a large bias current to withstand perturbations arising from fluctuation in the CDAC's output current. However, using a large bias current for the input amplifier 21 undesirably increases power consumption. An increase in power consumption is particularly undesirable in battery-powered applications, such as applications in which the ADC 20 is included in a mobile phone or other UE to digitize an analog signal from a microphone, such as a MEMS microphone.

Figure 3:
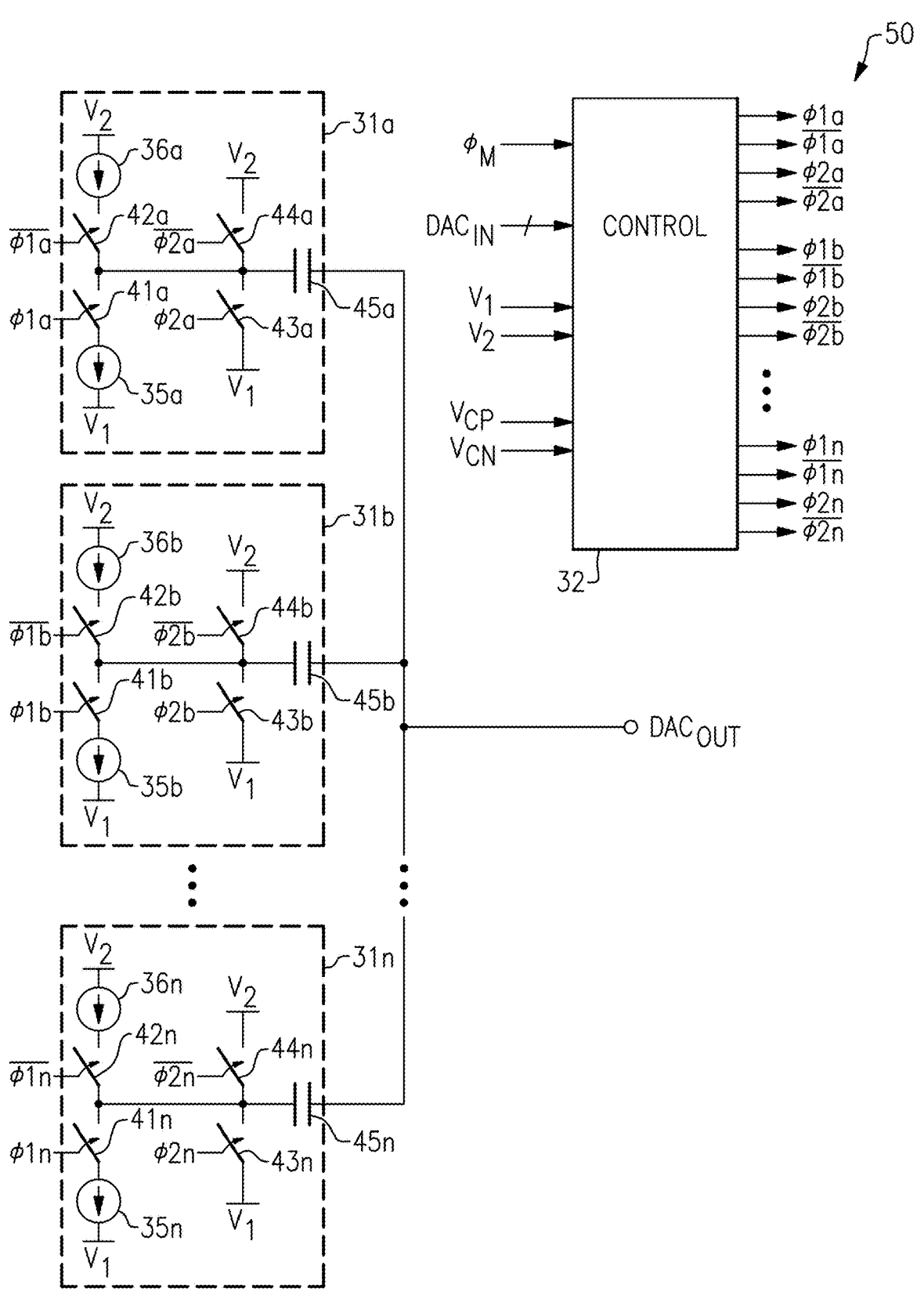
FIG. 3 is a schematic diagram of a capacitive digital-to-analog converter (CDAC) according to one embodiment.

FIG. 3 is a schematic diagram of a CDAC 50 according to one embodiment. The CDAC 50 includes CDAC cells 31a, 31b, . . . 31n and a control circuit 32. Thus, the CDAC 50 includes n CDAC cells (each serving as a controllable capacitor circuit of the CDAC 50), where n is any suitable integer. Thus, although FIG. 3 explicitly depicts three CDAC cells, the CDAC 50 can include more or fewer CDAC cells as indicated by the ellipses.

In the illustrated embodiment, the control circuit 32 receives a multi-bit digital input signal $DAC_{IN}$ for controlling an analog output provided at the output $DAC_{OUT}$ of the CDAC 50.

With continuing reference to FIG. 3, the control circuit 32 receives a master clock signal $\varphi_M$, a first voltage $V_1$ (for example, ground or other reference voltage), a second voltage $V_2$ (for example, a power supply voltage or other reference voltage), a first cascode voltage $V_{CN}$ (for biasing the gates of cascode NFETs), and a second cascode voltage $V_{CP}$ (for biasing the gates of cascode PFETs), in this embodiment. The cascode voltages $V_{CP}$ and Vex correspond to voltages that are shifted up or down, respectively, relative to bias voltages for current sources of the CDAC cells, as will be described further below with reference to the embodiments of FIGS. 4A and 4B.

As shown in FIG. 3, the control circuit 32 outputs a variety of clock signals for controlling the CDAC cells 31a, 31b, . . . 31n. For example, with respect to controlling the CDAC cell 31a, the clock signals include a first phase one clock signal ($\varphi 1a$), a second phase one clock signal ($\overline{\varphi 1a}$ or $\varphi 1a\_bar$), a first phase two clock signal ($\varphi 2a$), and a second phase two clock signal ($\overline{\varphi 2a}$ or $\varphi 2a\_bar$). Similar sets of clock signals are also included for controlling other CDAC cells. For example, the clock signals further include a first phase one clock signal ($\varphi 1b$), a second phase one clock signal ($\overline{\varphi 1b}$ or $\varphi 1b\_bar$), a first phase two clock signal ($\varphi 2b$), and a second phase two clock signal ($\overline{\varphi 2b}$ or $\varphi 2b\_bar$) for the CDAC cell 31b. The clock signals further include a first phase one clock signal ($\varphi 1n$), a second phase one clock signal ($\overline{\varphi 1n}$ or $\varphi 1n\_bar$), a first phase two clock signal ($\varphi 2n$), and a second phase two clock signal ($\overline{\varphi 2n}$ or $\varphi 2n\_bar$) for the CDAC cell 31n.

The control circuit 32 controls the clock signals to the CDAC cells 31a, 31b, . . . 31n based on the master clock signal $\varphi_M$ and the value of the multi-bit digital input signal $DAC_{IN}$. Thus, the clock signals to a particular one of the CDAC cells 31a, 31b, . . . 31n can change as the value of the multi-bit digital input signal $DAC_{IN}$ changes.

For example, when the value of the multi-bit digital input signal $DAC_{IN}$ indicates that one or more of the CDAC cells 31a, 31b, . . . 31n is selected to be charged or discharged for a particular cycle of the master clock signal $\varphi_M$, the control circuit 32 can control the clock signals of the selected CDAC cell(s) to perform a charge control operation (charging or discharging that CDAC cell's capacitor as indicated) for that cycle. The output current of the CDAC 50 is adjusted by charging or discharging the individual capacitors of the CDAC cells 31a, 31b, . . . 31n through current sources, as will be described below.

In the illustrated embodiment, the CDAC cell 31*a* includes a first or pull-down current source 35*a*, a second or pull-up current source 36*a*, a first switch 41*a*, a second switch 42*a*, a third switch 43*a*, a fourth switch 44*a*, and a capacitor 45*a*. The capacitor 45*a* is connected between the DAC output $DAC_{OUT}$ and an internal node of the CDAC cell 31*a*. Additionally, the first switch 41*a* and the first current source 35*a* are connected in series between the internal node and the first voltage $V_1$. Furthermore, the second switch 42*a* and the second current source 36*a* are connected in series between the internal node and the second voltage $V_2$. Additionally, the third switch 43*a* is connected between the internal node and the first voltage $V_1$. Furthermore, the fourth switch 44*a* is connected between the internal node and the second voltage $V_2$. The first switch 41*a* is controlled by the first phase one clock signal φ1*a*, the second switch 42*a* is controlled by the second phase one clock signal φ1*a*_bar, the third switch 43*a* is controlled by the first phase two clock signal φ2*a*, and the fourth switch 44*a* is controlled by the second phase two clock signal φ2*a*_bar.

The other CDAC cells include similar circuitry as the CDAC cell 31*a*. For example, the CDAC cell 31*b* includes a pull-down current source 35*b*, a pull-up current source 36*b*, a first switch 41*b*, a second switch 42*b*, a third switch 43*b*, a fourth switch 44*b*, and a capacitor 45*b*. Additionally, the CDAC cell 31*n* includes a pull-down current source 35*n*, a pull-up current source 36*n*, a first switch 41*n*, a second switch 42*n*, a third switch 43*n*, a fourth switch 44*n*, and a capacitor 45*n*.

In the illustrated embodiment, the capacitors 45*a*, 45*b*, . . . 45*n* are charged or discharged using current sources. Additionally, the current sources have reference voltages selected such that the current sources are automatically turned-off once the corresponding capacitors are fully charged or discharged.

For example, with respect to the CDAC cell 31*a*, both the first current source 35*a* and the third switch 43*a* are connected to the first voltage $V_1$. Similarly, both the second current source 36*a* and the fourth switch 44*a* are connected to the second voltage $V_2$.

By implementing the reference voltages of the current sources in this manner, the risk of over-charging or over-discharging the capacitors is avoided. Thus, large and/or complex calibration schemes for the current sources are not required. In comparison, CDACs that use other reference voltages (for example, half a supply voltage or VDD/2) suffer from a need for complex calibration schemes to ensure operability.

Moreover, since the CDAC 50 is adjusted by discharging the individual capacitors through current sources, the peak output current of the CDAC 50 is substantially determined by the current sources only.

Figures 4A, 4B:
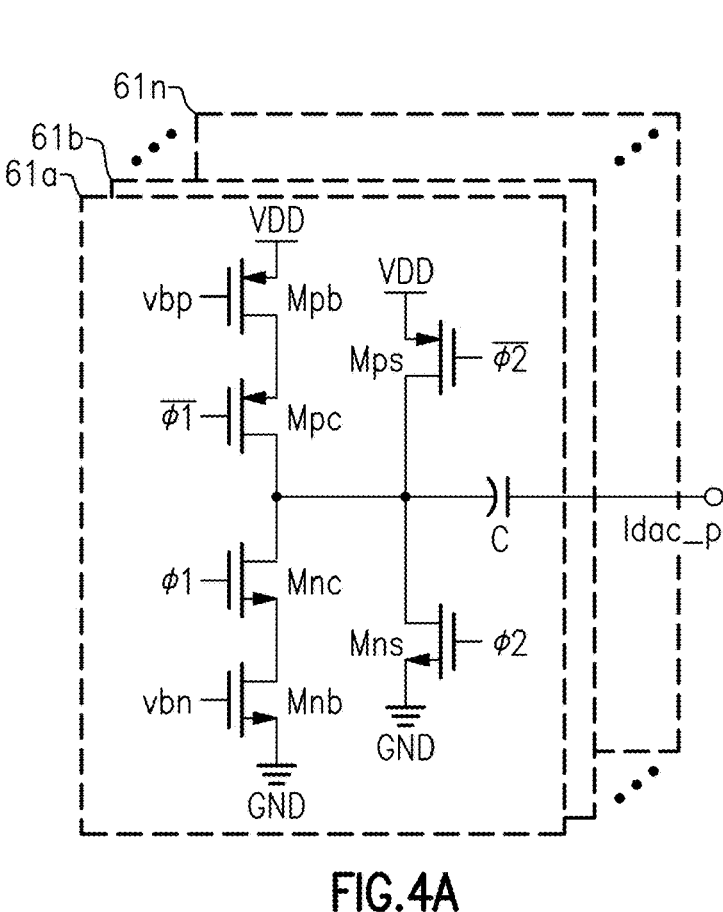
FIG. 4A is a schematic diagram of a CDAC according to another embodiment.
FIG. 4B depicts one example of waveforms for the CDAC of FIG. 4A.

FIG. 4A is a schematic diagram of a CDAC 70 according to another embodiment. FIG. 4B depicts one example of waveforms for the CDAC 70 of FIG. 4A.

The CDAC 70 includes CDAC cells 61*a*, 61*b*, . . . 61*n*, which are controlled by a control circuit, such as the control circuit 32 of FIG. 3. For clarity of the figure, only the circuitry of one of the CDAC cells (the CDAC cell 61*a*) is depicted. The other CDAC cells are schematically depicted as part of an array and can each include similar circuitry.

As shown in FIG. 4A, the CDAC cell 61*a* includes a pull-down current source n-type field-effect transistor (NFET) Mnb, a pull-up current source p-type field-effect transistor (PFET) Mpb, a first switch NFET Mnc, a first switch PFET Mpc, a second switch NFET Mns, a second switch PFET Mps, and a capacitor C. The gate of the pull-down current source NFET Mnb is biased by a pull-down current source bias signal vbn, while the gate of the pull-up current source PFET Mpb is biased by a pull-up current source bias signal vbp. The current source bias signals can be provided by any suitable bias circuit (not shown in FIG. 4A).

In the illustrated embodiment, the capacitor C is connected between an output Idac_p of the CDAC 70 and an internal node of the CDAC cell 61*a*. Additionally, the first switch NFET Mnc and the pull-down current source NFET Mnb are connected in series between the internal node and ground GND. Furthermore, the first switch PFET Mpc and the pull-up current source PFET Mpb are connected in series between the internal node and a power supply voltage VDD. Additionally, the second switch NFET Mns is connected between the internal node and ground GND, while the second switch PFET Mps is connected between the internal node and the power supply voltage VDD.

In FIG. 4A, each of the CDAC cells is coupled to an output Idac_p. The teachings herein are also applicable to implementations in which a first group of CDAC cells are each coupled to a non-inverted output (for example, Idac_p), and a second group of CDAC cells are each coupled to an inverted output (for example, Idac_n).

With continuing reference to FIG. 4A, the gate of the first switch NFET Mnc is controlled by a first phase one clock signal (φ1), while the gate of the first switch PFET Mpc is controlled by a second phase one clock signal ($\overline{φ1}$ or φ1_bar). Additionally, the gate of the second switch NFET Mns is controlled by a first phase two clock signal (φ2), while the gate of the second switch PFET Mps is controlled by a second phase two clock signal ($\overline{φ2}$ or φ2_bar).

In FIG. 4B, example clock signal waveforms are shown (for the case of an ith CDAC cell of the CDAC cell array of FIG. 4A, where i represents an example one of the CDAC cells) for a discharge operation of the CDAC cell. In this example, a portion of the depicted clock signals employ switching not only between the voltage levels of VDD or GND, but also to the voltage levels of the cascode voltages $V_{CN}$ or $V_{CP}$ to aid in providing suitable gate transistor voltages for turning on or off the transistors. In one example, the first cascode voltage $V_{CN}$ is shifted up relative to the bias voltage vbn but is smaller than VDD, while the second voltage $V_{CP}$ is shifted down relative to the bias voltage vbp but is greater than GND.

Using the cascode voltages $V_{CN}$ and $V_{CP}$ to control the clock signals in this manner improves the output impedances of the current sources Mnb and Mpb, respectively, thereby ensuring that their current is steady for a longer duration during switching. The graph of FIG. 4B also depicts a first plot 71 and a second plot 72 of a current (I) of the pull-down NFET current source Mnb. The CDAC properly performs for both current values, demonstrating the CDAC's resilience to variation in the current level of the current sources. The resilience allows the CDAC to operate without needing large and/or complex calibration schemes.

With reference to FIGS. 4A and 4B, for time t<0, the left side of the capacitor C is connected to VDD. Initially, φ2*i*_bar=0 (GND), and the second switch PFET Mps is closed to connect the internal node (corresponding to the left side of the capacitor C) to VDD. Additionally, φ1*i* and φ2*i* are 0 (to set switch NFETs Mnc and Mns to open), while φ1*i*_bar is $V_{CP}$.

The simulation continues for time t>0 to demonstrate discharging of the internal node (corresponding to the left side of the capacitor C) from VDD to GND. At first, φ2*i*_bar and φ1*i*_bar go to VDD, thus turning off the switch PFETs Mps and Mpc. Accordingly, there is no path to charge the capacitor C at this time instance.

From simulations, an estimate of time taken to charge/ discharge the capacitor C through the current sources is known. Allowing for a desired margin for current source magnitude variation due to process, voltage, and/or temperature (PVT), a time interval (t0) is chosen during which the capacitor C is expected to charge/discharge fully.

At time t0, $\varphi 2i$ goes to VDD to thereby turn on the second switch NFET Mns to absorb the noise current of the current source NFET Mnb. Thus, the noise of the current source NFET Mnb adds to the overall system noise only for a short duration.

Since the CDAC is multi-bit, the switching activity from VDD to GND (or GND to VDD) for a particular unit capacitor C is rare. Hence, for most of the time, the capacitors of the CDAC cells 61a, 61b, . . . 61n are connected either to VDD or GND through the corresponding second switch FETs Mps/Mns, which offer low resistance.

In comparison, if large resistors were used in series with each capacitor of a CDAC cell to control the peak current, then the input referred noise arising from inclusion of the resistors would have been significant, especially for applications in which the CDAC is used in a system with high input capacitance (for example, the ADC 20 of FIG. 2).

Furthermore, in the embodiment of FIGS. 4A and 4B, since the current sources Mnb/Mpb are automatically turned-off once the capacitor C is fully charged/discharged, calibration is not needed. For example, even if the magnitude of the current source varies due to PVT, as long as there is sufficient delay between $\varphi 1$ and $\varphi 2$ (t0 is sufficient and the time interval t0 is less than the clock period T for a cycle of the CDAC), the capacitor C is charged/discharged completely. Thus, although in FIG. 4B the current source NFET Mnb turns off at two different time instances for the plots 71 and 72 of different current values, both shut off times occur within the time interval to.

Accordingly, current source shutoff is automatic, and large and/or complex calibration circuitry for calibrating a precise current source level can be avoided. Furthermore, the choice of reference voltages as VDD and GND (and avoidance of VDD/2) avoids over-discharge of the capacitors by the current sources.

Moreover, since the CDAC 70 is not sensitive to the time interval to for the charging/discharging operation of the current sources, the CDAC 70 is robust to the non-ideality involved due to clock jitter in $\varphi 1$ and $\varphi 2$ (as well as $\varphi 1\_bar$ and $\varphi 2\_bar$).

Figure 5:
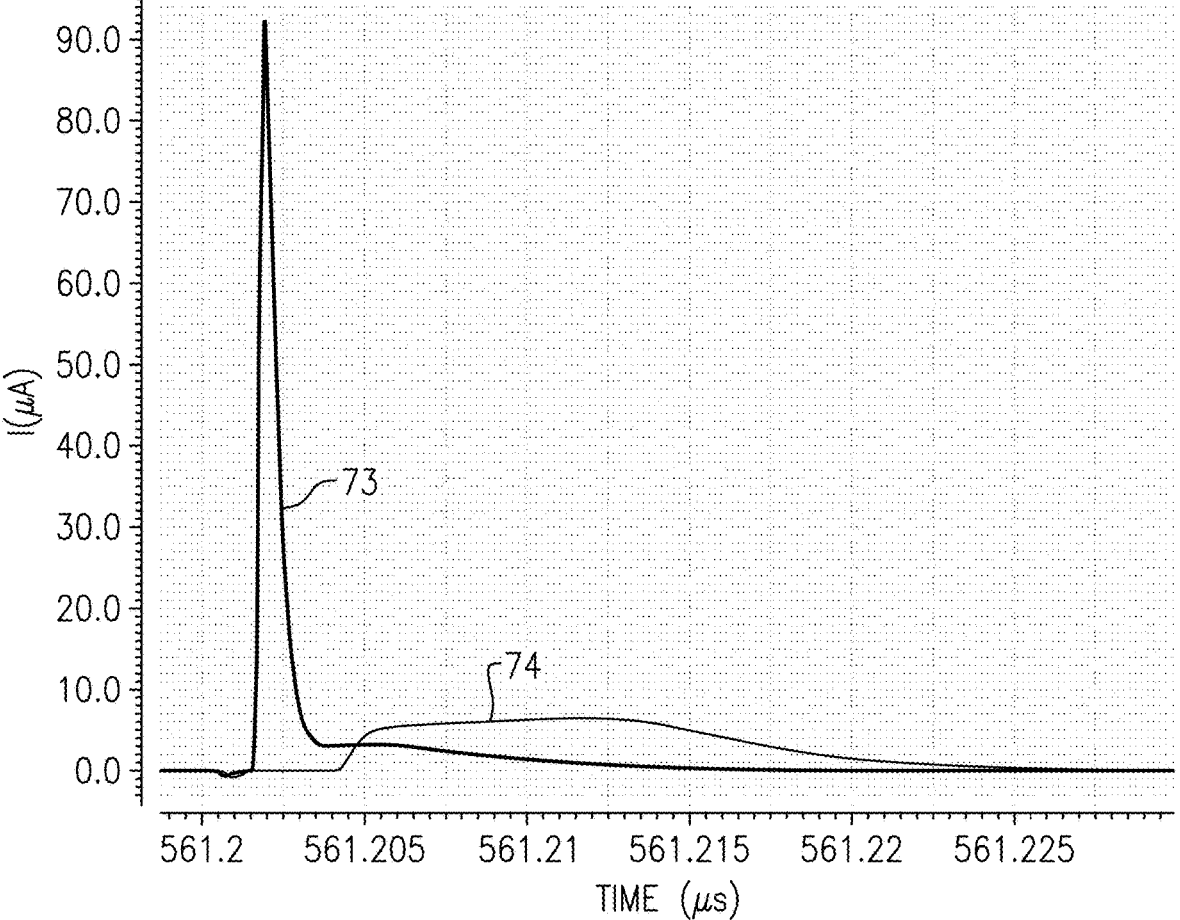
FIG. 5 is a graph of two examples of CDAC output current versus time.

FIG. 5 is a graph of two examples of CDAC output current versus time. The graph includes a first plot 73 of CDAC output current for a conventional CDAC and a second plot 74 of CDAC output current for one implementation of the CDAC 70 of FIG. 4A.

As shown in FIG. 5, the peak current of the implementation of the CDAC 70 of FIG. 4A is much less compared to the peak current of a conventional CDAC.

Figure 6:
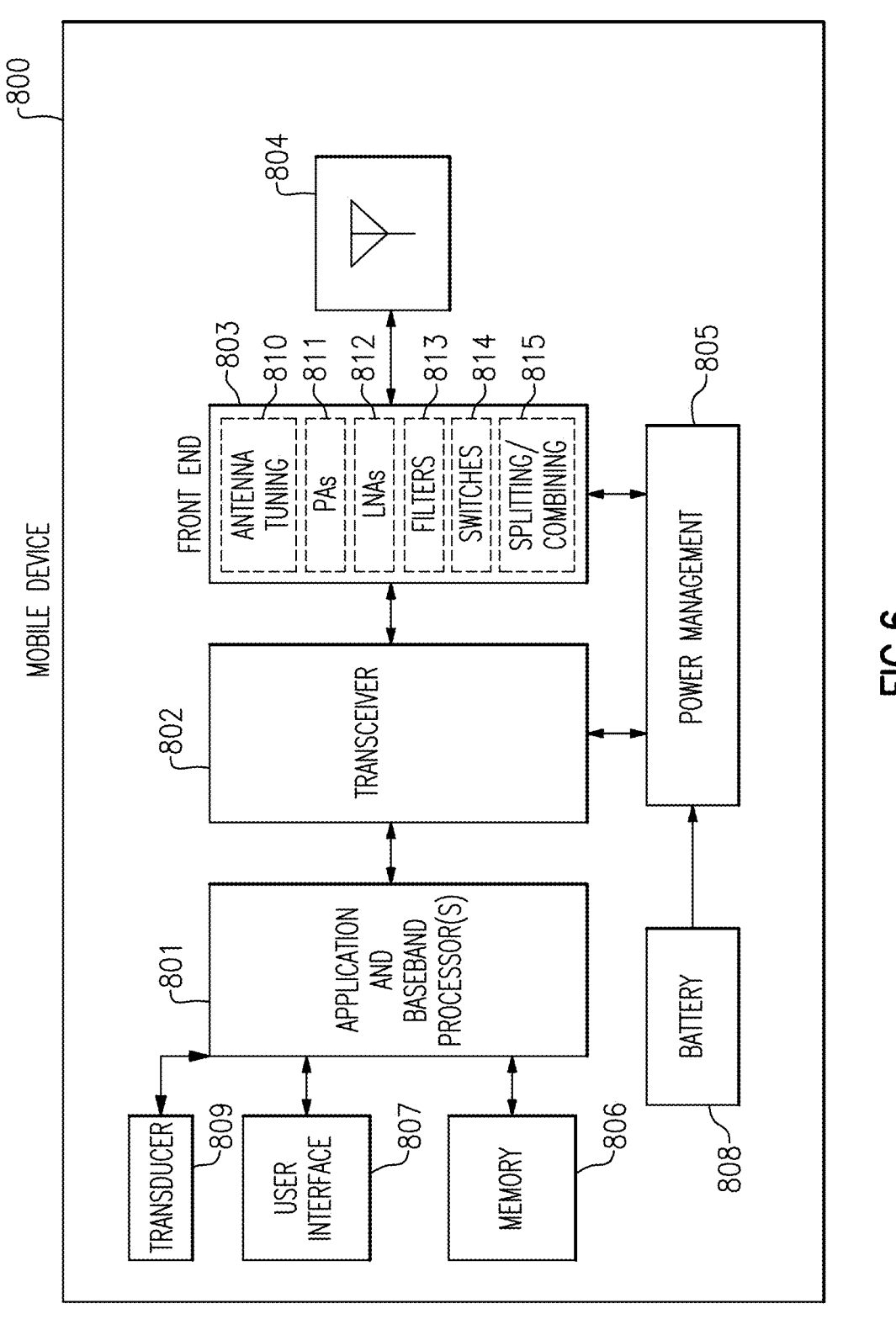
FIG. 6 is a schematic diagram of one embodiment of a mobile device.

FIG. 6 is a schematic diagram of one embodiment of a mobile device 800. The mobile device 800 includes application and baseband processor(s) 801, a transceiver 802, a front end system 803, antennas 804, a power management system 805, a memory 806, a user interface 807, a battery 808, and a transducer system 809. The transducer system 809 can be implemented in accordance with any of the embodiments herein.

The mobile device 800 can be used to communicate using a wide variety of communications technologies, including, but not limited to, 2G, 3G, 4G (including LTE, LTE- Advanced, and LTE-Advanced Pro), 5G NR, WLAN (for instance, WiFi), WPAN (for instance, Bluetooth and Zig-Bee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 6 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAS) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The application and baseband processor(s) 801 is coupled to the user interface 807 to facilitate processing of various user input and output (I/O), such as voice and data.

For example, the application and baseband processor(s) 801 is coupled to the transducer system 809, which can be used to process signals from one or more transducers to generate digital transducer data for the application and baseband processor(s) 801. In one example, the transducer system 809 includes at least one microphone, such as a MEMS microphone. The transducer system 809 can be implemented in a wide variety of ways, including, but not limited to, using any combination of features of the embodiments of FIGS. 1-4B.

The application and baseband processor(s) 801 provides the transceiver 802 with digital representations of transmit signals, which the transceiver 802 processes to generate RF signals for transmission. The application and baseband processor(s) 801 also processes digital representations of received signals provided by the transceiver 802. As shown in FIG. 6, the application and baseband processor(s) 801 is coupled to the memory 806 to facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 6, the power management system 805 receives a battery voltage from the battery 808. The battery 808 can be any suitable battery for use in the mobile device 800, including, for example, a lithium-ion battery.

Applications

The principles and advantages of the embodiments described herein can be used for a wide variety of applications.

For example, a CDAC can be used in a wide range of electronics for providing digital-to-analog conversion. CDACs are particularly well-suited for operating in feedback loops of data conversion systems for transducers. For example, a CDAC can be included in a feedback look of an ADC used to digitize the output of a microphone (for instance, a MEMS microphone) or other transducer. Such transducers can be deployed in a wide range of applications, including, but not limited to, microphones in radio frequency electronics that serve as user equipment (UE) in cellular networks. Such UE can include, for example, mobile phones (for instance, smartphones), tablets, vehicles, computers, and/or Internet of things (IoT) devices.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A capacitive digital-to-analog converter comprising:
an output terminal; and
a plurality of capacitive digital-to-analog converter cells
including a first capacitive digital-to-analog converter
cell, the first capacitive digital-to-analog converter cell
including a capacitor connected between the output
terminal and an internal node, a first current source
having a first terminal connected to a first voltage, a
first switch connected between the internal node and a
second terminal of the first current source, a second
current source having a first terminal connected to a
second voltage, a second switch connected between the
internal node and a second terminal of the second
current source, a third switch connected between the
internal node and the first voltage, and a fourth switch
connected between the internal node and the second
voltage.

2. The capacitive digital-to-analog converter of claim 1
further comprising a control circuit configured to control the
first switch with a first phase one clock signal and to control
the third switch with a first phase two clock signal, the first
phase two clock signal configured to activate after the first
phase one clock signal when the first capacitive digital-to-
analog converter cell discharges the internal node.

3. The capacitive digital-to-analog converter of claim 2
further comprising an input terminal configured to receive a
multi-bit digital input signal, the control circuit configured
to select a corresponding charge control operation for each
of the plurality of capacitive digital-to-analog converter cells
based on a value of the multi-bit digital input signal.

4. The capacitive digital-to-analog converter of claim 2
wherein activation of the first phase two clock signal occurs
after a time interval from activation of the first phase one
clock signal, the time interval greater than a discharge time
of the first current source to discharge the internal node.

5. The capacitive digital-to-analog converter of claim 4
wherein the first current source automatically turns off
during the time interval.

6. The capacitive digital-to-analog converter of claim 2
wherein the control circuit is further configured to control
the second switch with a second phase one clock signal and
to control the fourth switch with a second phase two clock
signal, the second phase two clock signal configured to
activate after the second phase one clock signal when the
first capacitive digital-to-analog converter cell charges the
internal node.

7. The capacitive digital-to-analog converter of claim 6
wherein the first switch and the third switch are n-type
field-effect transistors, and the second switch and the fourth
switch are p-type field-effect transistors.

8. The capacitive digital-to-analog converter of claim 6
wherein the first phase one clock signal toggles between the
first voltage and a first cascode voltage, the first phase two
clock signal toggles between the first voltage and the second
voltage, the second phase one clock signal toggles between
a second cascode voltage and the second voltage, and the
second phase two clock signal toggles between the first
voltage and the second voltage.

9. The capacitive digital-to-analog converter of claim 1
wherein the first voltage is ground and the second voltage is
a power supply voltage.

10. A mobile device comprising:
a processor configured to receive digital transducer data;
and
a transducer system configured to provide the digital
transducer data to the processor, the transducer system including a transducer configured to provide an analog
input signal to an input node and a capacitive digital-
to-analog converter including an output terminal that
provides feedback to the input node, the capacitive
digital-to-analog converter further including a plurality
of capacitive digital-to-analog converter cells including
a first capacitive digital-to-analog converter cell that
includes a capacitor connected between the output
terminal and an internal node, a first current source
having a first terminal connected to a first voltage, a
first switch connected between the internal node and a
second terminal of the first current source, a second
current source having a first terminal connected to a
second voltage, a second switch connected between the
internal node and a second terminal of the second
current source, a third switch connected between the
internal node and the first voltage, and a fourth switch
connected between the internal node and the second
voltage.

11. The mobile device of claim 10 wherein the capacitive
digital-to-analog converter further includes a control circuit
configured to control the first switch with a first phase one
clock signal and to control the third switch with a first phase
two clock signal, the first phase two clock signal configured
to activate after the first phase one clock signal when the first
capacitive digital-to-analog converter cell discharges the
internal node.

12. The mobile device of claim 10 wherein the transducer
is a microphone.

13. A transducer system comprising:
a transducer configured to generate an analog input signal;
an input amplifier configured to receive the analog input
signal at an input; and
a capacitive digital-to-analog converter including an out-
put terminal connected to the input of the input ampli-
fier, the capacitive digital-to-analog converter further
including a plurality of capacitive digital-to-analog
converter cells including a first capacitive digital-to-
analog converter cell that includes a capacitor con-
nected between the output terminal and an internal
node, a first current source having a first terminal
connected to a first voltage, a first switch connected
between the internal node and a second terminal of the
first current source, a second current source having a
first terminal connected to a second voltage, a second
switch connected between the internal node and a
second terminal of the second current source, a third
switch connected between the internal node and the
first voltage, and a fourth switch connected between the
internal node and the second voltage.

14. The transducer system of claim 13 wherein the
capacitive digital-to-analog converter further includes a con-
trol circuit configured to control the first switch with a first
phase one clock signal and to control the third switch with
a first phase two clock signal, the first phase two clock signal
configured to activate after the first phase one clock signal
when the first capacitive digital-to-analog converter cell
discharges the internal node.

15. The transducer system of claim 14 wherein activation
of the first phase two clock signal occurs after a time interval
from activation of the first phase one clock signal, the time
interval greater than a discharge time of the first current
source to discharge the internal node.

16. The transducer system of claim 14 wherein the control
circuit is further configured to control the second switch
with a second phase one clock signal and to control the
fourth switch with a second phase two clock signal, the second phase two clock signal configured to activate after the second phase one clock signal when the first capacitive digital-to-analog converter cell charges the internal node.

17. The transducer system of claim 16 wherein the first switch and the third switch are n-type field-effect transistors, and the second switch and the fourth switch are p-type field-effect transistors.

18. The transducer system of claim 16 wherein the first phase one clock signal toggles between the first voltage and a first cascode voltage, the first phase two clock signal toggles between the first voltage and the second voltage, the second phase one clock signal toggles between a second cascode voltage and the second voltage, and the second phase two clock signal toggles between the first voltage and the second voltage.

19. The transducer system of claim 13 further comprising a loop filter configured to generate a filtered output signal based on filtering an output signal of the input amplifier, a sampling switch configured to generate a plurality of samples based on sampling the filtered output signal, and a quantizer configured to generate the a multi-bit digital signal based on quantizing the plurality of samples.

20. The transducer system of claim 19 wherein the capacitive digital-to-analog converter further includes an input terminal configured to receive the multi-bit digital signal.

\* \* \* \* \*